(12) United States Patent
McHugh et al.

(10) Patent No.: US 6,722,909 B1
(45) Date of Patent: Apr. 20, 2004

(54) ELECTRICAL CONNECTOR WITH LEVER RETAINER

(75) Inventors: Robert G. McHugh, Golden, CO (US); Hao-Yun Ma, Tu-chen (TW)

(73) Assignee: Hon Hai Precision Ind. Co., Ltd., Taipei Hsieh (TW)

( * ) Notice: Subject to any disclaimer, the term of this patent is extended or adjusted under 35 U.S.C. 154(b) by 0 days.

(21) Appl. No.: 10/418,433

(22) Filed: Apr. 17, 2003

(51) Int. Cl.[7] .............................................. H01R 13/62
(52) U.S. Cl. .......................................... 439/331; 439/73
(58) Field of Search ............................... 439/331, 330, 439/70, 342

(56) References Cited

U.S. PATENT DOCUMENTS

| | | | | |
|---|---|---|---|---|
| 5,256,080 A | * | 10/1993 | Bright | 439/342 |
| 5,302,853 A | * | 4/1994 | Volz et al. | 257/707 |
| 5,448,449 A | * | 9/1995 | Bright et al. | 361/704 |
| 5,493,475 A | * | 2/1996 | Lin | 361/710 |
| 5,688,140 A | | 11/1997 | McHugh | |
| 6,243,267 B1 | * | 6/2001 | Chuang | 361/704 |
| 6,332,251 B1 | * | 12/2001 | Ho et al. | 24/459 |
| 6,343,017 B1 | * | 1/2002 | Yu et al. | 361/704 |
| 6,371,786 B1 | * | 4/2002 | Howell et al. | 439/342 |
| 6,381,836 B1 | * | 5/2002 | Lauruhn et al. | 29/831 |
| 6,401,807 B1 | * | 6/2002 | Wyler et al. | 165/121 |
| 6,419,514 B1 | * | 7/2002 | Yu | 439/342 |
| 6,449,157 B1 | * | 9/2002 | Chu | 361/704 |
| 6,485,313 B1 | * | 11/2002 | Lu et al. | 439/83 |
| 6,485,320 B1 | * | 11/2002 | Ma | 439/342 |
| 6,508,658 B1 | * | 1/2003 | Szu et al. | 439/342 |
| 6,557,625 B1 | * | 5/2003 | Ma | 165/80.2 |
| 6,570,763 B1 | * | 5/2003 | McHugh et al. | 361/704 |
| 6,574,109 B1 | * | 6/2003 | McHugh et al. | 361/719 |
| 6,618,253 B1 | * | 9/2003 | Szu et al. | 361/719 |
| 6,636,424 B2 | * | 10/2003 | Lee et al. | 361/705 |
| 6,638,093 B1 | * | 10/2003 | Chang | 439/342 |
| 6,648,656 B1 | * | 11/2003 | Ma | 439/73 |
| 6,648,664 B1 | * | 11/2003 | McHugh et al. | 439/331 |

* cited by examiner

Primary Examiner—Ross Gushi
(74) Attorney, Agent, or Firm—Wei Te Chung

(57) ABSTRACT

An LGA connector (1) includes a housing (2), a fastening frame (3), a clip (4), and a lever (5). The fastening frame includes a base (30) and a retainer (32). The base includes a projection (3024) formed in a junction of a first end portion (302) and a first sidewall (303). The projection defines a guiding groove (3027) in a bottom thereof. A pair of receiving slots (3028) is defined in the projection at centers of two opposite inner sidewalls bounding the groove. The retainer includes a portion having a fastening slot (3222), and a pair of protrusions (3220) protruding from central parts of opposite sidewalls thereof. Each protrusion has an interference block (3224) protruding from an outer top side thereof. Each protrusion of the retainer is interferentially received in the corresponding slots of the base, for stably and firmly positioning the lever in the fastening frame.

11 Claims, 8 Drawing Sheets

ELECTRICAL CONNECTOR WITH LEVER RETAINER

BACKGROUND OF THE INVENTION

1. Field of the Invention

The present invention relates to an electrical connector for electrically connecting an electronic package such as a land grid array (LGA) chip with a circuit board such as a printed circuit board (PCB), and particularly to an LGA electrical connector with an operational lever and a lever retainer.

2. Description of Prior Art

Land grid array (LGA) electrical connectors are widely used in personal computer (PC) systems to electrically connect land grid array (LGA) chips with printed circuit boards (PCBs). An LGA electrical connector comprises an insulative housing, a multiplicity of terminals received in the housing in a rectangular array, a fastening frame surrounding the housing, a metal clip attached to the fastening frame, and an operational lever. U.S. Pat. No. 5,688,140 discloses this kind of conventional LGA electrical connector.

FIG. 6 shows a conventional LGA electrical connector 8 comprising an insulative housing 81, a multiplicity of conductive terminals 85 received in the housing 81, a fastening frame 82 surrounding the housing 81, a metal clip 84 attached to the fastening frame 82, and an operational lever 83 attached to the fastening frame 82. The clip 84 comprises two opposite pressing side plates 841, a first end plate 842, and a second end plate 843 opposite from the first end plate 842. A hook portion 8420 extends outwardly from a center of the first end plate 842. The second end plate 843 comprises a pair of pivot portions 8430 formed in opposite sides thereof. The lever 83 comprises an operational arm 830, a pair of pivot axles 831 perpendicularly extending from one end of the operational arm 830, and an offset pressing portion 832 between the two pivot axles 831. The housing 81 has a rectangular main body 810. The main body 810 defines a multiplicity of passageways 8101 arranged in a rectangular array, for receiving the corresponding terminals 85. A pair of opposite ends 812 extends from two diagonally opposite corners of the portion 810. A pair of mounting holes 8120 is defined in the ends 812 respectively, for fixing the housing 81 on a PCB (not shown).

The fastening frame 82 comprises a rectangular space 820 defined in a middle thereof, for accommodating an LGA chip 86. The space 820 is bounded by a first end portion 822, a second end portion 824 opposite from the first end portion 822, a first sidewall 823 interconnecting both the first end portion 822 and the second end portion 824, and a second sidewall 825 opposite from the first sidewall 823. A pair of first stepped holes 8220 is defined in opposite sides of the first end portion 822. A first arch-shaped projection 8222 protrudes from a junction of the first end portion 822 and the second sidewall 825. An arch-shaped slot 8226 is defined in the first projection 8222. A second arch-shaped projection 8224 protrudes from a junction of the first sidewall 823 and the first end portion 822. An arch-shaped guiding groove 8228 is defined in a bottom of the second projections 8224, in communication with the space 820. The slot 8226 and the groove 8228 are used for receiving the two pivot axles 831 of the lever 83 when the lever 83 is engaged with the fastening frame 82. A pair of second stepped holes 8240 is defined in the second end portion 824. The first and the second stepped holes 8220, 8240 are used for cooperatively fixing the fastening frame 82 on the PCB. A pair of arched pivot protrusions 8242 protrudes from opposite sides of the second end portion 824, for receiving the pivot portions 8430 of the clip 84. A cutout 8246 is defined in a middle of an inner side of the second end portion 824. A first resilient arm 8244 extends from the second end portion 824 adjacent the cutout 8246 to a point proximate to the second sidewall 825. The second sidewall 825 has a second resilient arm 8250 formed in an inner side thereof, proximate to the first resilient arm 8244. The first and the second resilient arms 8244, 8250 are used for fastening and releasing the LGA chip 86.

Referring to FIGS. 7 and 8, in use, the clip 84 is firstly oriented perpendicular to the fastening frame 82 in a first position. The lever 83 is oriented at a first position, with the pressing portion 832 being perpendicular to the fastening frame 82 and at a highest point. This enables the LGA chip 86 to be put into the fastening frame 82 for subsequent attachment to the housing 81 of the electrical connector 8. Then, the clip 84 is rotated to a horizontal second position, with the pressing side plates 841 abutting against the LGA chip 86. The operational arm 830 of the lever 83 is rotated to a second position, and the pressing portion 832 is retained in the hook portion 842 of the clip 84. Thus, the LGA chip 86 is stably fastened in the electrical connector 8. The LGA chip 86 is electrically connected with the terminals 85 received in the housing 81, and accordingly is electrically connected with the PCB.

In the electrical connector 8, the groove 8228 is in communication with the space 820 and a bottom of the fastening frame 82. Thus, the corresponding pivot axle 831 of the lever 83 can freely move in the groove 8228 of the frame 82 in directions both parallel to and perpendicular to the second projection 8224. In addition, there is no supplementary fixing structure between the fastening frame 82 and the lever 83. Accordingly, the lever 83 is easily disconnected from the fastening frame 82 in use of the electrical connector 8. This can result in failure of stable retention of the LGA chip 86 in the housing 81. This can further lead to disruption or failure of electrical connection between the LGA chip 86 and the PCB.

A new electrical connector that overcomes the above-mentioned problems is desired.

SUMMARY OF THE INVENTION

An object of the present invention is to provide an LGA electrical connector having a fastening frame with a retainer that facilitates stable and reliable connection of a lever to the fastening frame.

In order to achieve the above object, an LGA connector in accordance with a preferred embodiment of the present invention comprises an insulative housing, a multiplicity of terminals received in the housing, a fastening frame surrounding the housing, a metal clip pivotally mounted to the fastening frame, and a lever engaged with the fastening frame. The fastening frame comprises a base and a retainer formed separately from the base. The base includes a projection protruding from a junction of a first end portion and a first sidewall. The projection defines a guiding groove in a bottom thereof. A pair of receiving slots is defined in the projection at centers of two opposite inner sidewalls bounding the groove. The retainer comprises a first portion and a second portion perpendicular to the first portion. The second portion comprises a fastening slot adapted for receiving the lever in a top thereof, and a pair of protrusions protruding from central parts of two opposite sidewalls thereof. Each protrusion has an interference block protruding from an outer top side thereof. Each protrusion of the retainer is interferentially received in the corresponding slots of the base, for stably and firmly positioning the lever in the fastening frame.

Other objects, advantages and novel features of the present invention will become more apparent from the following detailed description when taken in conjunction with the accompanying drawings, in which:

DESCRIPTION OF THE PREFERRED EMBODIMENT

Reference will now be made to the drawings to describe the present invention in detail.

Figure 1:
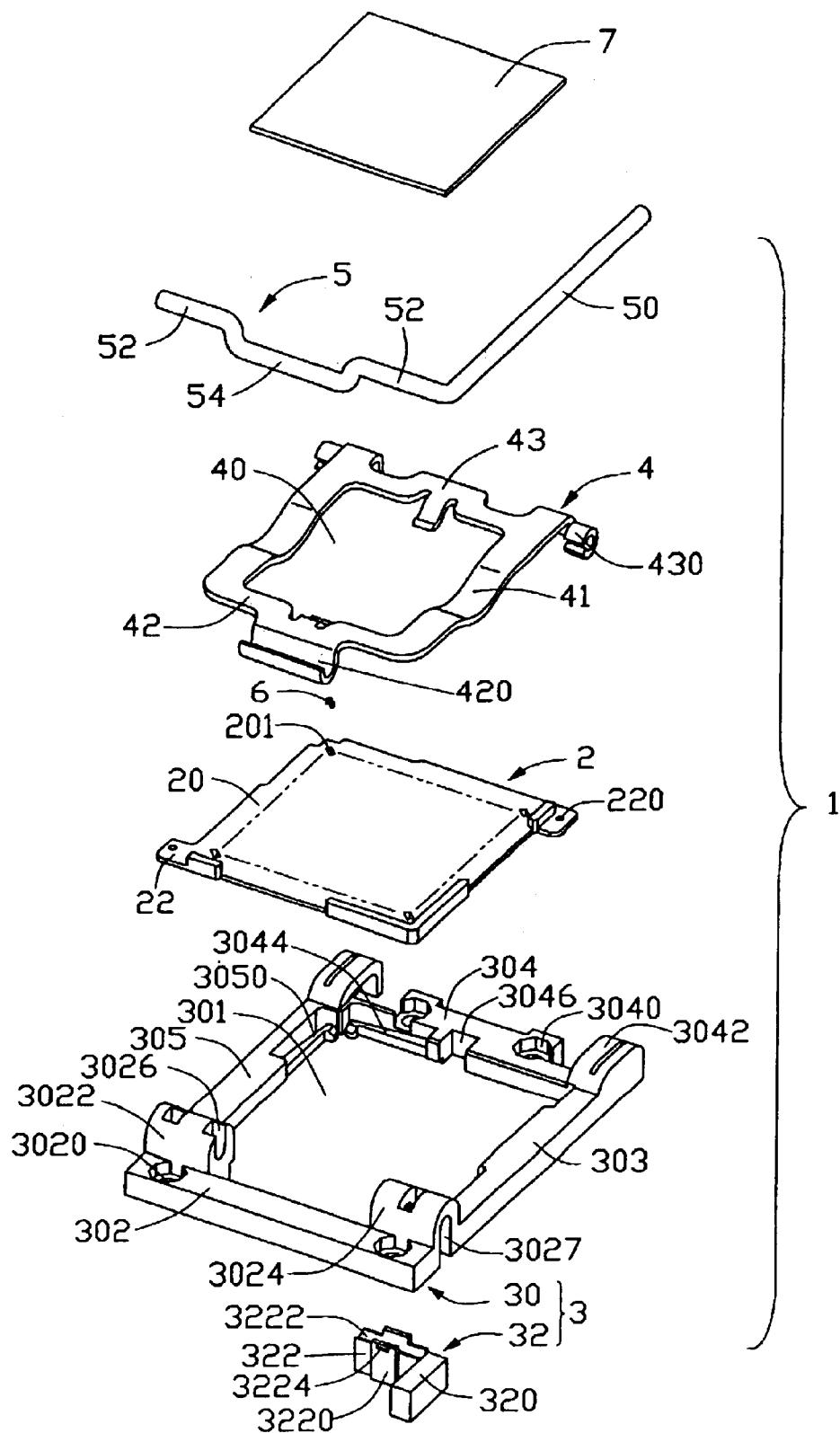
FIG. 1 is a simplified, exploded isometric view of an LGA connector in accordance with the preferred embodiment of the present invention, together with an LGA chip.

Referring to FIG. 1, an LGA electrical connector 1 in accordance with the preferred embodiment of the present invention is adapted for electrically connecting an electronic package such as a land grid array (LGA) chip 7 with a circuit substrate such as a printed circuit board (PCB) (not shown). The electrical connector 1 comprises an insulative housing 2, a multiplicity of conductive terminals 6 received in the housing 2 in a rectangular array, a fastening frame 3 surrounding the housing 2, a metal clip 4 pivotally attached to the fastening frame 3, and an operational lever 5 pivotally attached to the fastening frame 3.

The lever 5 comprises an operational arm 50, a pair of pivot axles 52 extending perpendicularly from one end of the operational arm 50, and an offset pressing portion 54 between the two pivot axles 52.

The clip 4 defines an opening 40 in a middle thereof. The opening 40 is bounded by two opposite pressing side plates 41, a first end plate 42 interconnecting the two side plates 41, and a second end plate 43 opposite from the first end plate 42 and interconnecting the two side plates 41. A hook portion 420 extends outwardly from a center of the first end plate 42, for being pressed by the pressing portion 54 of the lever 5 in use of the LGA connector 1. The second end plate 43 comprises a pair of pivot portions 430 formed in opposite sides thereof respectively.

The housing 2 has a rectangular main body 20. The main body 20 defines a multiplicity of passageways 201 arranged in a rectangular array, for receiving the corresponding terminals 6. A pair of opposite end portions 22 extends from two diagonally opposite corners of the conductive portion 20. A pair of mounting holes 220 is defined in the end portions 22 respectively, for fixing the housing 2 on the PCB.

Figure 2:
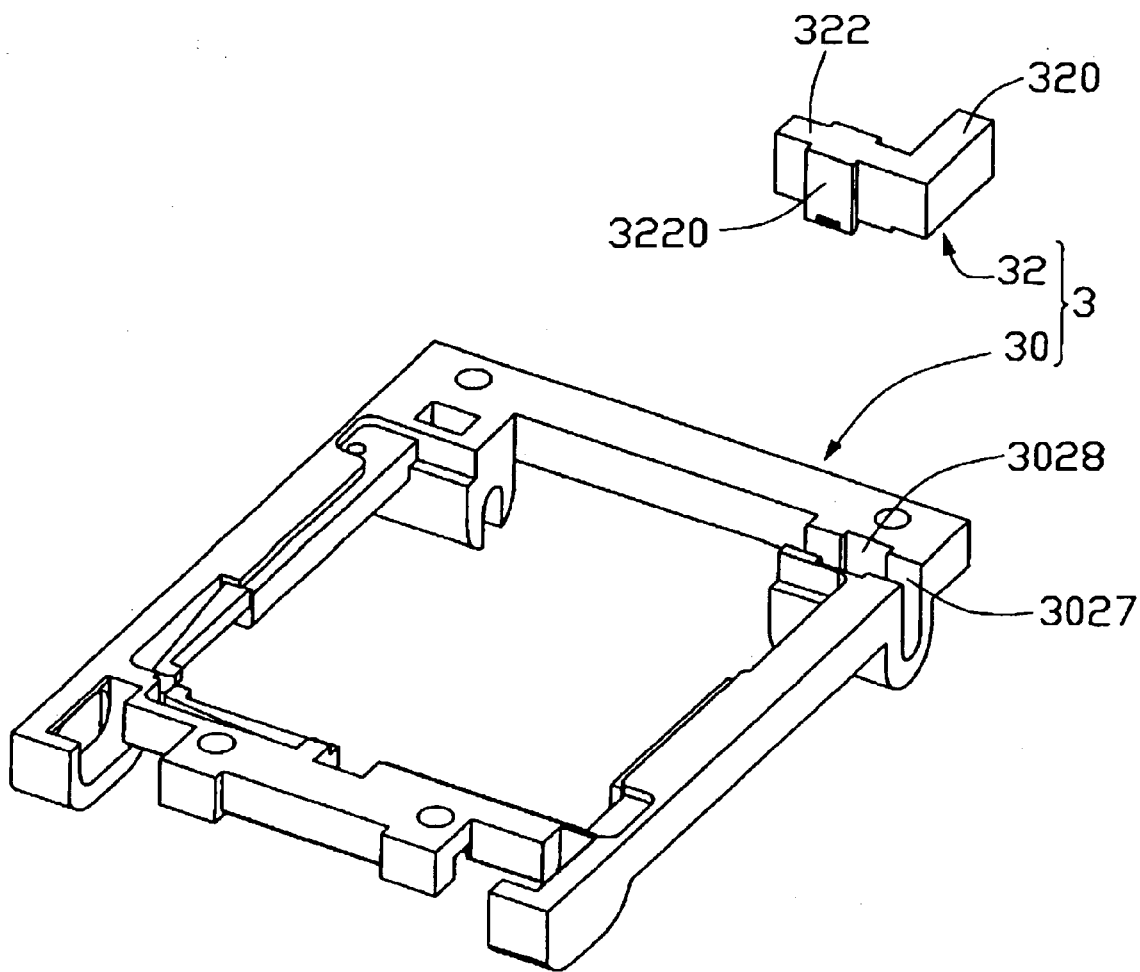
FIG. 2 is an exploded, isometric inverted view of a fastening frame of the electrical connector of FIG. 1.
Figure 3:
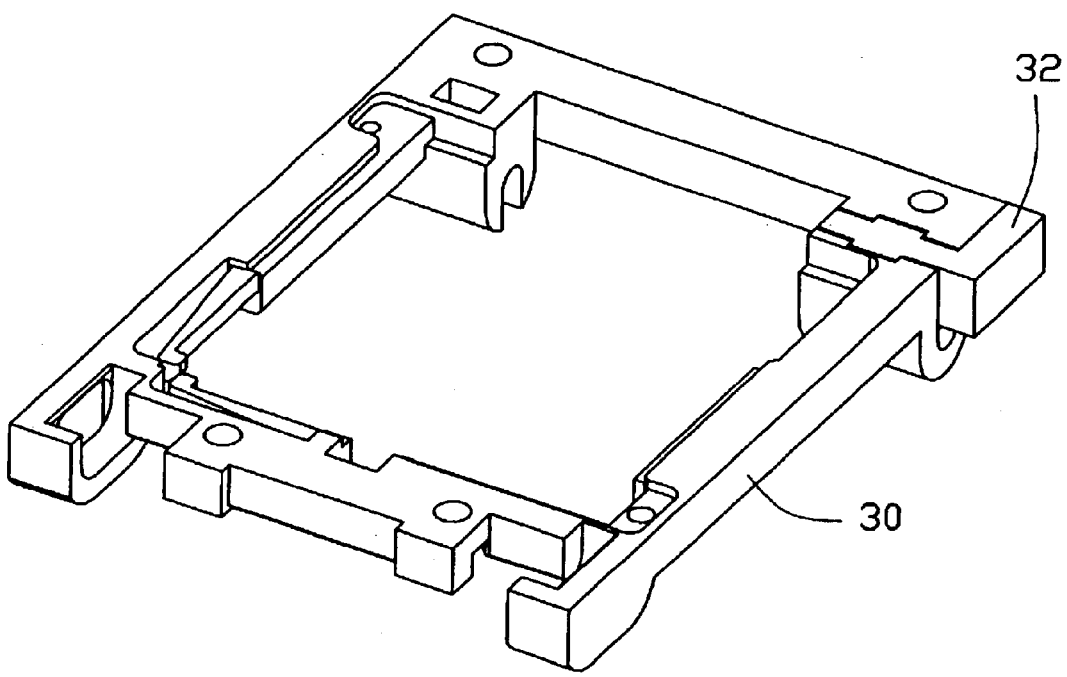
FIG. 3 is an assembled view of FIG. 2.

Referring also to FIGS. 2 and 3, the fastening frame 3 comprises a rectangular base 30, and an L-shaped lever retainer 32 formed separately from the base 30. A rectangular space 301 is defined in a center of the base 30, for receiving the LGA chip 7. The space 301 is bounded by a first end portion 302, a second end portion 304 opposite from the first end portion 302, a first sidewall 303 interconnecting the first end portion 302 and the second end portion 304, and a second sidewall 305 opposite from the first sidewall 303 and interconnecting the first end portion 302 and the second end portion 304. A pair of first stepped hole 3020 is defined in opposite sides of the first end portion 302. A first arch-shaped projection 3022 protrudes from a junction of the first end portion 302 and the second sidewall 305. An arch-shaped receiving groove 3026 is defined in the first projection 3022. A second arch-shaped projection 3024 protrudes from a junction of the first end portion 302 and the first sidewall 303, opposite from the first projection 3022. An arch-shaped guiding groove 3027 is defined in a bottom of the second projection 3024, in communication with the space 301. When the lever 5 is engaged with the base 30, the receiving groove 3026 and the guiding groove 3027 are used for receiving the two pivot axles 52 of the lever 5. A pair of receiving slots 3028 is defined in the second projection 3024 at centers of two opposite inner sidewalls bounding the groove 3027. A pair of second stepped holes 3040 is defined in the second end portion 304. The first and second stepped holes 3020, 3040 are used for cooperatively fastening the base 30 on the PCB. A pair of arched pivot protrusions 3042 protrudes from opposite sides of the second end portion 304, for receiving the pivot portions 430 of the clip 4. When the clip 4 is attached to the base 30, the pivot portions 430 of the clip 4 are pivotally mounted to the pivot protrusions 3042 of the base 30. A cutout 3046 is defined in a middle of an inner side of the second end portion 304. A first resilient arm 3044 extends from the second end portion 304 adjacent the cutout 3046 to a point proximate to the second sidewall 305. The second sidewall 305 has a second resilient arm 3050 formed in an inner side thereof, proximate to the first resilient arm 3044. The first and second resilient arms 3044, 3050 are used for cooperatively fastening and releasing the LGA chip 7.

The lever retainer 32 comprises a short first portion 320, and a longitudinal second portion 322 perpendicular to the first portion 320. In assembly of the base 30 and the lever retainer 32, the first portion 320 abuts against a side of the first end portion 302 of the base 30. The second portion 322 is retained in the guiding groove 3027 of the base 30. A pair of fixing protrusions 3220 protrudes from central parts of opposite sidewalls of the second portion 302, the fixing protrusions 3220 being received in the corresponding receiving slots 3028 of the base 30. A pair of interference blocks 3224 is formed on outer top sides of the fixing protrusions 3220 respectively, the interference blocks 3224 facilitating interferential retention of the lever retainer 32 in the base 30. A curved fastening slot 3222 is defined in a top of the second portion 322, the fastening slot 3222 being adapted for receiving a part of one of the pivot axles 52 of the lever 5 after the lever 5 is received in the guiding groove 3027 of the base 30.

Figure 4:
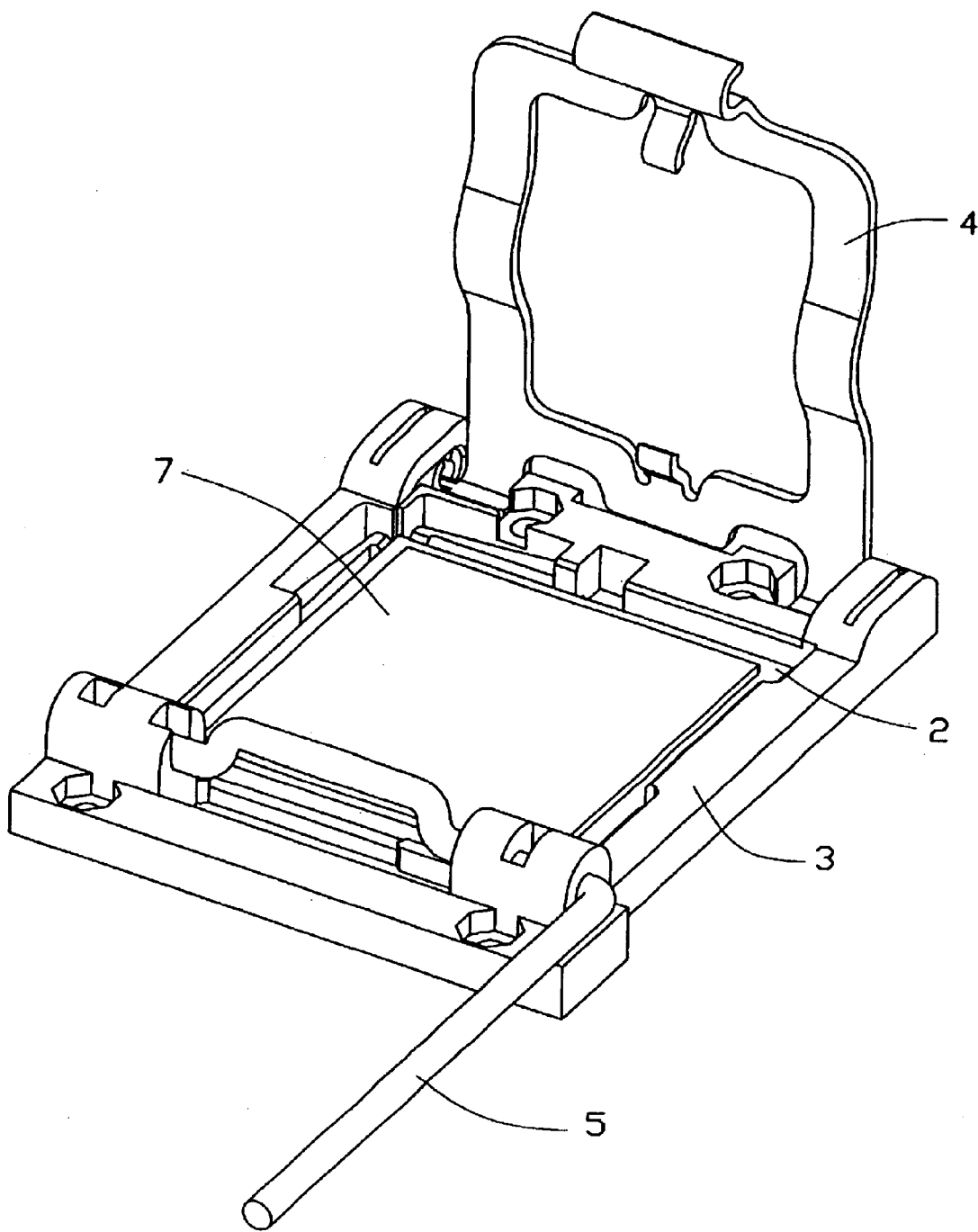
FIG. 4 is an assembled view of FIG. 1, showing a clip and a lever of the LGA connector in respective first positions.

Referring to FIG. 4, in use, the clip 4 is oriented perpendicular to the fastening frame 3 in a first position. The lever 5 is oriented at a first position, with the pressing portion 54 being perpendicular to the base 30 and at a highest position. This enables the LGA chip 7 to be put into the fastening frame 3 for subsequent attachment to the housing 2 of the electrical connector 1.

Figure 5:
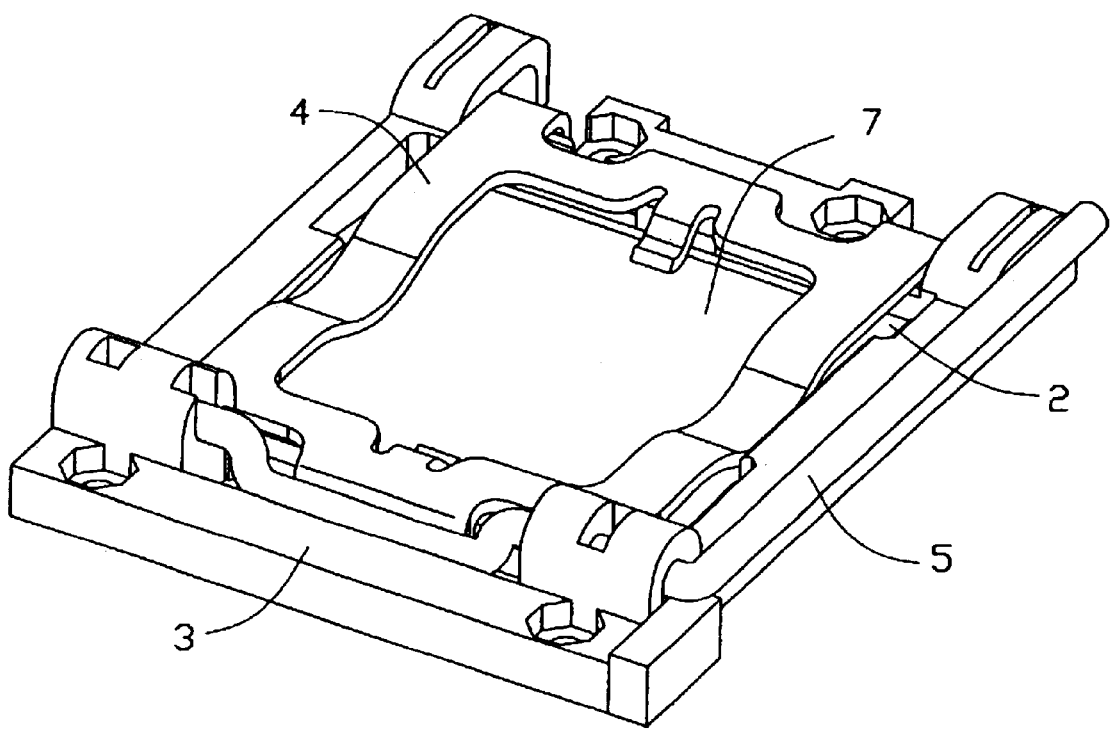
FIG. 5 is similar to FIG. 4, but showing the clip and the lever in respective second positions.
Figure 6:
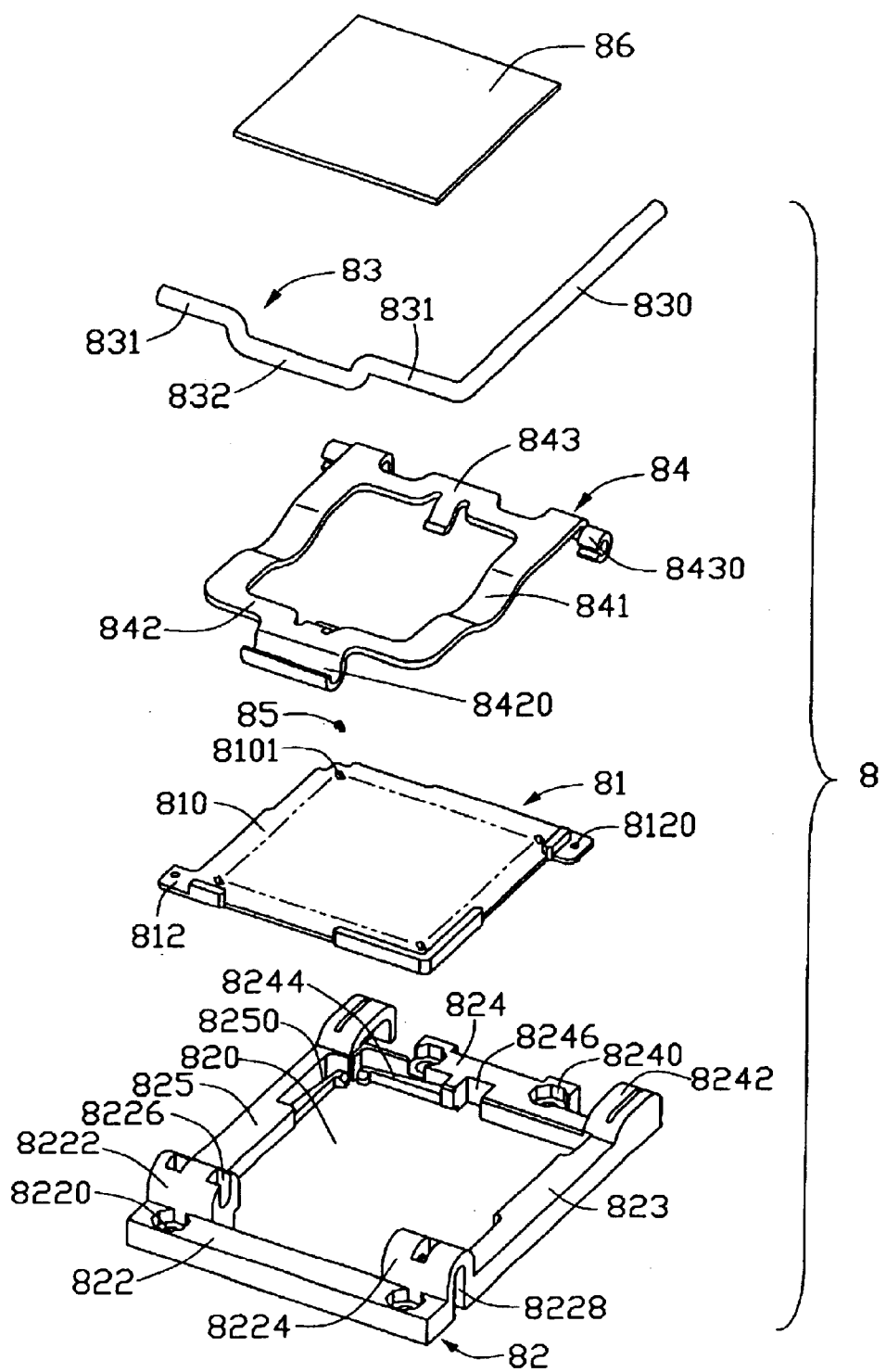
FIG. 6 is a simplified, exploded isometric view of a conventional LGA connector, together with an LGA chip.
Figure 7:
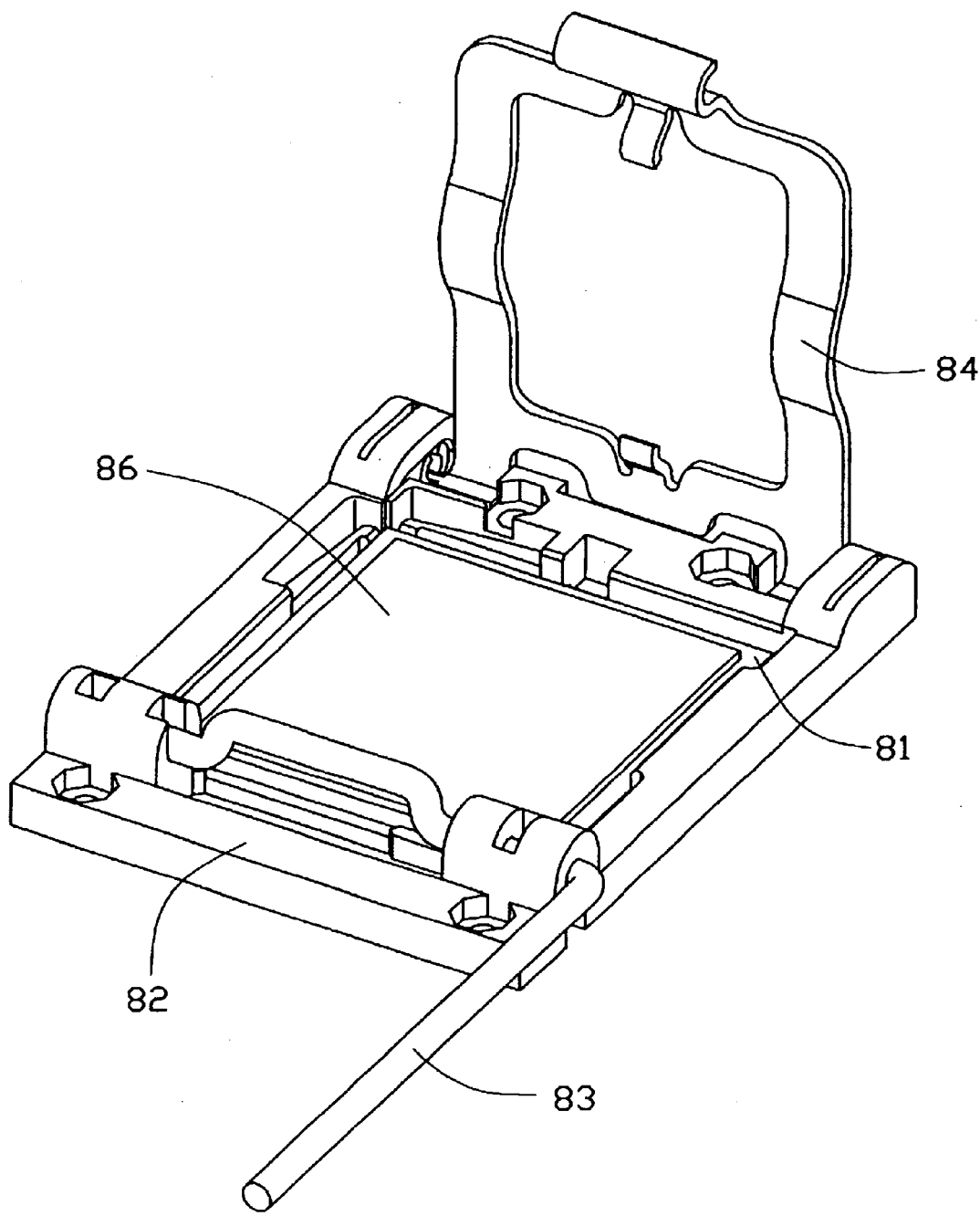
FIG. 7 is a assembled view of FIG. 6, showing a clip and a lever of the LGA connector in respective first positions.
Figure 8:
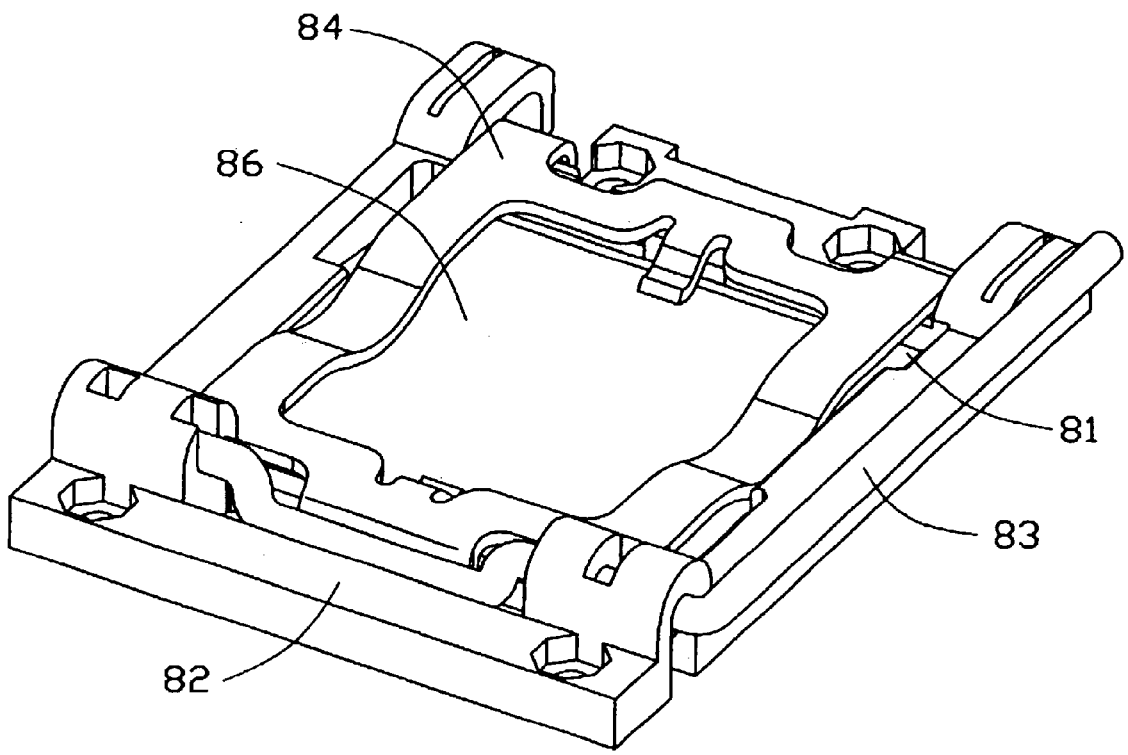
FIG. 8 is similar to FIG. 7, but showing the clip and the lever in respective second positions.

Referring to FIG. 5, the clip 4 is rotated to a horizontal second position, with the pressing side plates 41 abutting against the LGA chip 7 retained in the fastening frame 3. The operational arm 50 of the lever 5 is rotated to a second position, and the pressing portion 54 is retained in the hook portion 420 of the clip 4. Thus, the LGA chip 7 is stably and securely fastened in the electrical connector 1. The LGA chip 7 is electrically connected with the terminals 6 received in the housing 2, and accordingly is electrically connected with the PCB.

Because the second portion 322 of the lever retainer 32 is interferentially retained in the guiding groove 3027 of the base 30, the lever retainer 32 resists sliding out of the base 30 even under repeated operation between the first position and the second position of the clip 4. Thus the LGA chip 7 can remain firmly and securely received in the fastening frame 3 of the LGA connector 1 in use of the LGA connector 1. Electrical connection between the LGA chip 7 and the PCB is stable and reliable.

While a preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector for electrically connecting an electronic package with a circuit substrate, the electrical connector comprising:

a housing defining a plurality of passageways therein;

a plurality of terminals received the passageways of the housing;

a fastening frame surrounding the housing and comprising a base and a retainer, the base having a first end portion and a second end portion, the first end portion defining a groove;

a lever attached to the first end portion of the base; and a clip mounted to the second end portion of the base;

wherein the retainer is accommodated in the groove of the base for stably and securely positioning the lever in the fastening frame.

2. The electrical connector as claimed in claim 1, wherein the retainer comprises a first portion and a second portion perpendicular to the first portion, the second portion has a pair of protrusions protruding from central parts of opposite sidewalls thereof and a fastening slot defined in a top thereof for receiving a part of a pivot portion of the lever.

3. The electrical connector as claimed in claim 2, wherein each of the protrusions has an interference block formed on an outer top side thereof.

4. The electrical connector as claimed in claim 1, wherein the groove of the base defines a pair of receiving slots in centers of two opposite sidewalls thereof.

5. The electrical connector as claimed in claim 4, wherein each of the protrusions of the retainer is interferentially received in the corresponding receiving slot of the base.

6. The electrical connector as claimed in claim 1, wherein the base further comprises a first sidewall interconnecting the first end portion and the second end portion, a second sidewall opposite to the first sidewall, and a space bounded by the first end portion, the second end portion, the first sidewall and the second sidewall.

7. The electrical connector as claimed in claim 6, wherein a projection protrudes from a junction of the first end portion and the first sidewall.

8. The electrical connector as claimed in claim 7, wherein the groove of the base is defined in a bottom of the projection, in communication with the space.

9. An electrical connector comprising:

an insulative housing with a plurality of terminals therein;

a fastening frame surrounding the housing and including a base defining opposite first and second end portions;

a lever pivotally attached to the first end portion;

a clip pivotally attached to the second end portion;

the first end portion including opposite first and second projections, said first projection essentially defining a hole while said second projection essentially defining a guiding groove extending therethrough in a lateral direction and fully exposed to and communicating with an exterior in one vertical direction perpendicular to said lateral direction so as to allow a crank-like cam pressing portion of said lever to pass when said lever is assembled to the housing in said lateral direction from said second end portion; wherein a retainer is inserted into the guiding groove to not only support the lever but also prevent removal of the lever.

10. The connector as claimed in claim 9, wherein said vertical direction is downward.

11. The connector as claimed in claim 9, wherein said clip includes a hook portion latchably engaged with the pressing portion of the lever.

* * * * *